(12) United States Patent
Zhang et al.

(10) Patent No.: US 11,927,659 B2
(45) Date of Patent: Mar. 12, 2024

(54) METHOD AND APPARATUS FOR FREQUENCY DRIFT CORRECTION OF MAGNETIC RESONANCE CEST IMAGING, AND MEDIUM AND IMAGING DEVICE

(71) Applicant: ZHEJIANG UNIVERSITY, Zhejiang (CN)

(72) Inventors: Yi Zhang, Hangzhou (CN); Ruibin Liu, Hangzhou (CN); Hongxi Zhang, Hangzhou (CN); Dan Wu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 67 days.

(21) Appl. No.: 17/878,073

(22) Filed: Aug. 1, 2022

(65) Prior Publication Data
US 2022/0381866 A1    Dec. 1, 2022

Related U.S. Application Data

(63) Continuation of application No. PCT/CN2021/084260, filed on Mar. 31, 2021.

(30) Foreign Application Priority Data

Mar. 31, 2020  (CN) .......................... 202010244399.3

(51) Int. Cl.
*G01R 33/565*  (2006.01)
*G01R 33/56*  (2006.01)

(52) U.S. Cl.
CPC ... *G01R 33/56572* (2013.01); *G01R 33/5601* (2013.01); *G01R 33/5659* (2013.01); *G01R 33/5605* (2013.01)

(58) Field of Classification Search
CPC ............ G01R 33/5605; G01R 33/5659; G01R 33/5601; G01R 33/56572
See application file for complete search history.

(56) References Cited

U.S. PATENT DOCUMENTS 9,097,779 B2 * 8/2015 Fautz ................. G01R 33/5605
9,638,781 B2 * 5/2017 Miyazaki ........... G01R 33/5605
(Continued)

FOREIGN PATENT DOCUMENTS

CN    101109791 A    1/2008
CN    101162262 A    4/2008
(Continued)

OTHER PUBLICATIONS

First Office Action(JP2022-547891); dated Jul. 26, 2023.
(Continued)

*Primary Examiner* — Gregory H Curran
(74) *Attorney, Agent, or Firm* — W&G Law Group

(57) ABSTRACT

Disclosed is a method and apparatus for frequency drift correction of magnetic resonance CEST imaging, and a medium and an imaging device. The method comprises the following steps: firstly, in the frequency drift correction module, exciting a target slice by using a small flip-angle radio-frequency pulse, and acquiring a single line of free induction decay signals or two lines of non-phase encoding gradient echo signals; secondly, respectively calculating a value of the main magnetic field frequency drift according to phase information and an acquisition time of the single line of free induction decay signals or the two lines of non-phase encoding gradient echo signals; then adjusting the center frequency of the magnetic resonance device in real time according to the calculated value of the main magnetic field (Continued)

frequency drift, and achieving the real-time correction of main magnetic field frequency drift; and finally, performing CEST imaging.

8 Claims, 3 Drawing Sheets

(56) References Cited

U.S. PATENT DOCUMENTS

| | | | |
|---|---|---|---|
| 10,024,943 | B2 | 7/2018 | Machii et al. |
| 11,474,182 | B2 * | 10/2022 | Keupp ............. G01R 33/56509 |
| 2016/0047876 | A1 | 2/2016 | Alhamud et al. |
| 2019/0125207 | A1 | 5/2019 | Bildhauer et al. |
| 2021/0373100 | A1 | 12/2021 | Zhang et al. |

FOREIGN PATENT DOCUMENTS

| | | |
|---|---|---|
| CN | 101357063 A | 2/2009 |
| CN | 104224179 A | 12/2014 |
| CN | 104569882 A | 4/2015 |
| CN | 109521383 A | 3/2019 |
| CN | 109901088 A | 6/2019 |
| CN | 111413655 A | 7/2020 |
| IN | 102334045 A | 1/2012 |
| JP | 06277196 A | 12/1993 |
| JP | 2001112735 A | 4/2001 |
| JP | 2015000161 A | 1/2015 |
| JP | 2017023485 A | 2/2017 |
| JP | 2021503316 A | 2/2021 |
| WO | 2020078131 A1 | 4/2020 |

OTHER PUBLICATIONS

International Search Report (PCT/CN2021/084260); dated Jun. 21, 2021.

CN First Office Action(202010244399.3); dated Sep. 17, 2020.

* cited by examiner

METHOD AND APPARATUS FOR FREQUENCY DRIFT CORRECTION OF MAGNETIC RESONANCE CEST IMAGING, AND MEDIUM AND IMAGING DEVICE

CROSS-REFERENCE TO RELATED APPLICATIONS

The present application is a continuation of International Application No. PCT/CN2021/084260, filed on Mar. 31, 2021, which claims priority to Chinese Application No. 202010244399.3, filed on Mar. 31, 2020, the contents of both of which are incorporated herein by reference in their entireties.

TECHNICAL FIELD

The present disclosure relates to the technical field of magnetic resonance, in particular to the field of frequency drift correction of magnetic resonance CEST imaging.

BACKGROUND

CEST (Chemical Exchange Saturation Transfer) imaging is a new molecular magnetic resonance imaging technology. Compared with conventional magnetic resonance imaging technology, this technology can indirectly detect the spatial distribution of endogenous low-concentration metabolites, and has proved its clinical application value in many diseases. Since CEST imaging is affected by many interference effects such as direct water saturation, Magnetization Transfer Ratio Asymmetry (MTRasym) analysis is usually used to remove other interference effects to extract the pure CEST effect. However, MTRasym analysis is very sensitive to the frequency drift of the main magnetic field, which will lead to significant overestimation or underestimation of the CEST effect by MTRasym analysis, thus affecting the robustness and repeatability of magnetic resonance CEST imaging. Although some researchers have adopted some post-processing methods to correct the frequency drift of the main magnetic field, the post-processing methods cannot solve the problem of decreasing the fat suppression efficiency caused by the frequency drift of the main magnetic field, resulting in occurrence of higher fat signals in the CEST images, which reduces the clinical diagnostic value of the CEST images. A magnetic resonance CEST imaging sequence based on the frequency drift correction module of free induction decay signals or gradient echo signals can not only correct the frequency drift of the main magnetic field in real time, but also ensure the effective suppression of fat signals, thus improving the robustness and repeatability of magnetic resonance CEST imaging.

SUMMARY

The purpose of the present disclosure is to provide a magnetic resonance CEST imaging sequence based on a frequency drift correction module of free induction decay signals or gradient echo signals, which can realize real-time correction of the main magnetic field frequency drift and ensure effective suppression of fat signals, thereby improving the robustness and repeatability of magnetic resonance CEST imaging.

In order to achieve the above purpose, the present disclosure adopts the following technical solution:

In the first aspect, the present disclosure provides a method for frequency drift correction of magnetic resonance CEST imaging, comprising the following steps:

S1, controlling a CEST imaging system to emit a radio-frequency pulse with a flip angle less than 90° to excite a target slice;

S2, after the radio-frequency pulse is sent out, acquiring a single line of free induction decay signals and implementing step S21, or acquiring a line of non-phase encoding gradient echo signals at two different times respectively and implementing step S22;

S21, dividing the acquired free induction decay signals into odd-numbered lines and even-numbered lines, and dividing an inter-line phase difference between the odd-numbered lines and the even-numbered lines by the sampling period to obtain a value of the main magnetic field frequency drift;

S22, dividing the phase difference of the acquired two lines of non-phase encoding gradient echo signals by the signal acquisition time difference therebetween to obtain the value of the main magnetic field frequency drift;

S3, adjusting the center frequency of the magnetic resonance device in real time according to the obtained value of the main magnetic field frequency drift.

In an embodiment, the calculation method of the value of the main magnetic field frequency drift in S21 is as below:

Dividing the single line of free induction decay signal, and taking data at odd sampling points in the signals as odd-numbered lines and data at even sampling point as even-numbered lines; calculating a representative value of phase differences of corresponding sampling points in the odd-numbered lines and the even-numbered lines as an inter-line phase difference between odd-numbered lines and even-numbered lines, and then calculating a value of a main magnetic field frequency drift from the inter-line phase difference and the sampling period, wherein the representative value comprises an arithmetic mean or a median.

Furthermore, the calculation formula of the value of the main magnetic field frequency drift $\Delta f$ is:

$$\Delta f = \frac{\overline{\varphi}_{odd-even}}{2\pi \cdot \Delta T}$$

where $\Delta T$ is the sampling period of the free induction decay signals; $\overline{\varphi}_{odd-even}$ is the inter-line phase difference between the odd-numbered lines and the even-numbered lines, and the calculation formula is:

$$\overline{\varphi}_{odd-even} = \frac{\sum_{i=1}^{n} \varphi^{odd-even}_{i}}{n}$$

where $\varphi^{odd-even}_i$ is the phase difference between the $i^{th}$ data sampling point of the odd-numbered lines and the $i^{th}$ data sampling point of the even-numbered lines, n is the number of the sampling points in the even-numbered lines or the odd-numbered lines.

In an embodiment, the calculation method of the value of the main magnetic field frequency drift in S22 is as below:

Calculating a representative value of phase differences of corresponding sampling points in two lines of non-phase encoding gradient echo signals as an inter-line phase difference between the two lines of non-phase encoding gradient echo signals, and then calculating a value of the main magnetic field frequency drift from the inter-line phase difference and the sampling time interval of the two lines of non-phase encoding gradient echo signals.

Furthermore, the calculation formula of the value Δf of the main magnetic field frequency drift is:

$$\Delta f = \frac{\overline{\varphi}_{2-1}}{2\pi \cdot \Delta TE_{2-1}}$$

where $\Delta TE_{2-1}$ is the sampling time interval of the two lines of non-phase encoding gradient echo signals; $\overline{\varphi}_{2-1}$ is the inter-line phase difference between the two lines of non-phase encoding gradient echo signals, and the calculation formula is:

$$\overline{\varphi}_{2-1} = \frac{\sum_{i=1}^{n}\varphi^{2-1}{}_{i}}{n}$$

where $\varphi^{2-1}{}_i$ is the phase difference between respective $i^{th}$ data sampling points of the two lines of non-phase encoding gradient echo signals, n is the number of the sampling points in each line of non-phase encoding gradient echo signals.

In an embodiment, the flip angle in S1 is less than 10°.

In the second aspect, the present disclosure provides an apparatus for frequency drift correction of magnetic resonance CEST imaging, comprising a frequency drift correction module, wherein the frequency drift correction module is used for executing S1 to S3;

S1, controlling a CEST imaging system to emit a radio-frequency pulse with a flip angle less than 90° to excite a target slice;

S2, after the radio-frequency pulse is sent out, acquiring a single line of free induction decay signals and implementing step S21, or acquiring a line of non-phase encoding gradient echo signals at two different times respectively and implementing step S22;

S21, dividing the acquired free induction decay signals into odd-numbered lines and even-numbered lines, and dividing the inter-line phase difference between the odd-numbered lines and the even-numbered lines by the sampling period to obtain a value of the main magnetic field frequency drift;

S22, dividing the phase difference of the acquired two lines of non-phase encoding gradient echo signals by the signal acquisition time difference therebetween to obtain the value of the main magnetic field frequency drift;

S3, adjusting the center frequency of the magnetic resonance device in real time according to the obtained the value of the main magnetic field frequency drift.

In an embodiment, the calculation method of the value of the main magnetic field frequency drift in S21 is as below:

Dividing the single line of free induction decay signal, and taking data at odd sampling points in the signals as odd-numbered lines and data at even sampling point as even-numbered lines; calculating a representative value of phase differences of corresponding sampling points in the odd-numbered lines and the even-numbered lines as an inter-line phase difference between odd-numbered lines and even-numbered lines, and then calculating a value of the main magnetic field frequency drift from the inter-line phase difference and the sampling period, wherein the representative value comprises an arithmetic mean or a median.

Furthermore, the calculation formula of the value Δf of the main magnetic field frequency drift is:

$$\Delta f = \frac{\overline{\varphi}_{odd-even}}{2\pi \cdot \Delta T}$$

where $\Delta T$ is the sampling period of the free induction decay signals; $\overline{\varphi}_{odd-even}$ is the inter-line phase difference between the odd-numbered lines and the even-numbered lines, and the calculation formula is:

$$\overline{\varphi}_{odd-even} = \frac{\sum_{i=1}^{n}\varphi^{odd-even}{}_{i}}{n}$$

where $\varphi^{odd-even}{}_i$ is a phase difference between the $i^{th}$ data sampling point of the odd-numbered lines and the $i^{th}$ data sampling point of the even-numbered lines, n is a number of the sampling points in the even-numbered lines or the odd-numbered lines.

In an embodiment, the calculation method of the value of the main magnetic field frequency drift in S22 is as below:

Calculating a representative value of phase differences of corresponding sampling points in two lines of non-phase encoding gradient echo signals as an inter-line phase difference between the two lines of non-phase encoding gradient echo signals, and then calculating the value of the main magnetic field frequency drift from the inter-line phase difference and the sampling interval of the two lines of non-phase encoding gradient echo signals.

Furthermore, the calculation formula of the value Δf of the main magnetic field frequency drift is:

$$\Delta f = \frac{\overline{\varphi}_{2-1}}{2\pi \cdot \Delta TE_{2-1}}$$

where $\Delta TE_{2-1}$ is the sampling time interval of the two lines of non-phase encoding gradient echo signals; $\overline{\varphi}_{2-1}$ is the inter-line phase difference between the two lines of non-phase encoding gradient echo signals, and the calculation formula is:

$$\overline{\varphi}_{2-1} = \frac{\sum_{i=1}^{n}\varphi^{2-1}{}_{i}}{n}$$

where $\varphi^{2-1}{}_i$ is the phase difference between respective $i^{th}$ data sampling points of the two lines of non-phase encoding gradient echo signals, n is the number of the sampling points in each line of non-phase encoding gradient echo signals.

In an embodiment, the flip angle in S1 is less than 10°.

In the third aspect, the present disclosure provides a computer-readable storage medium, wherein a computer program is stored on the storage medium, and the computer program, when executed by a processor, implements method for frequency drift correction of magnetic resonance CEST imaging according to any solution in the first aspect.

In the fourth aspect, the present disclosure provides a magnetic resonance imaging device, comprising a magnetic resonance scanner and a control unit, wherein a computer program is stored in the control unit, and the computer program, when executed, is configured for implementing any solution in the first aspect; the magnetic resonance scanner performs magnetic resonance CEST imaging according to the corrected center frequency.

In the present disclosure, the magnetic resonance scanner refers to a complete set of equipment that can realize magnetic resonance scanning imaging. The conventional magnetic resonance CEST imaging technique can be used for magnetic resonance CEST imaging. A conventional magnetic resonance CEST imaging sequence usually includes three modules: a CEST saturation module, a spectral presaturation with inversion recovery fat suppression module, and a turbo spin echo acquisition module.

Compared with the prior art, the present disclosure has the following beneficial effects: in the frequency drift correction module of the present disclosure, a single line of free induction decay signals or two lines of non-phase encoding gradient echo signals is acquired, the phase difference between odd and even parts of the free induction decay signals or the inter-line phase difference between two lines of non-phase coded gradient echo signals is calculated, and then the phase difference is divided by the time difference to obtain the value of the main magnetic field frequency drift. Then, the center frequency of the magnetic resonance device is adjusted in real time according to the value of the main magnetic field frequency drift, which can not only correct the frequency drift of the main magnetic field in real time, but also ensure the effective suppression of fat signals, thus improving the robustness and repeatability of magnetic resonance CEST imaging, providing a guarantee for the reliability of the subsequent quantitative analysis of the CEST images and enhancing the clinical application value of magnetic resonance CEST imaging.

DESCRIPTION OF EMBODIMENTS

The present disclosure will be further illustrated and explained below with reference to the drawings and specific embodiments.

In an embodiment of the present disclosure, a method for frequency drift correction of magnetic resonance CEST imaging is provided, which can be applied to a traditional magnetic resonance CEST imaging system to correct the frequency drift of the main magnetic field of the system in real time before the CEST imaging. The specific steps of the method are as follows:

S1: firstly, a control instruction is sent to a CEST imaging system to emit a radio-frequency pulse with a flip angle less than 90° (preferably less than 10°) to excite a target slice;

S2, the induced signal of the radio-frequency pulse is immediately acquired after it is sent out, wherein two different signals can be acquired and the frequency drift values of the main magnetic field are calculated by a specific method respectively. The following two methods will be described separately.

Figure 1:
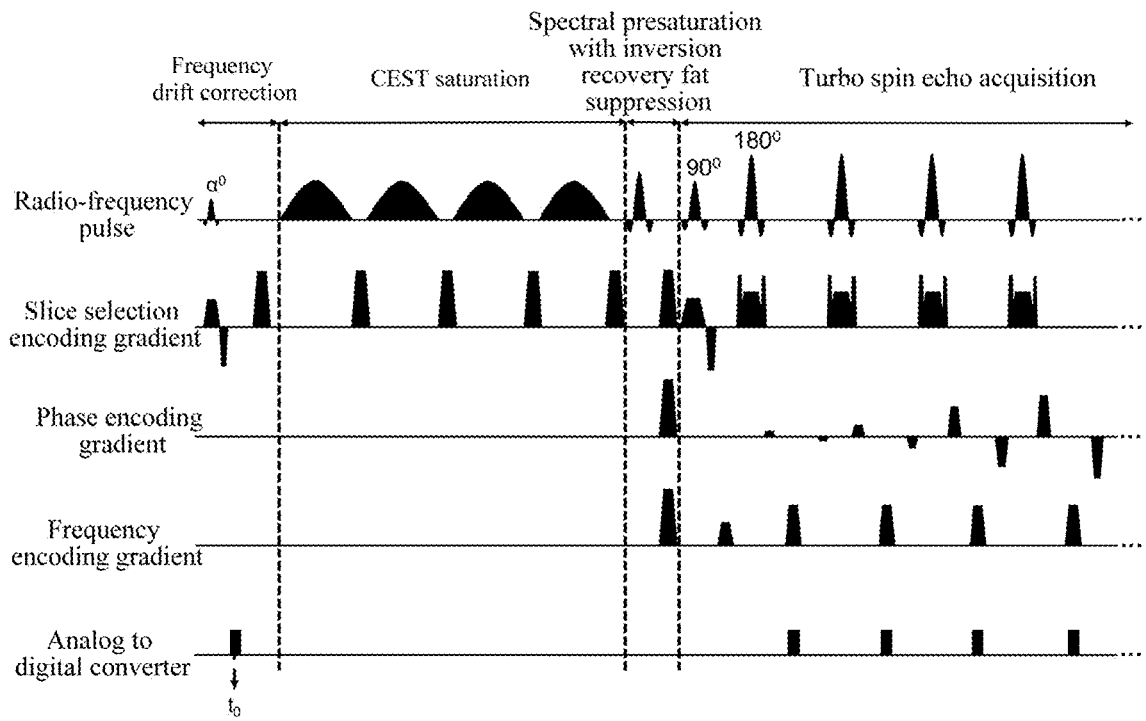
FIG. 1 is a block diagram of a magnetic resonance CEST imaging sequence based on a frequency drift correction module for acquiring free induction decay signals.

The first method is to acquire a single line of free induction decay signals immediately after the radio-frequency pulse is sent out. As shown in FIG. 1, the acquisition time of single line of free induction decay signal is recorded as the time $t_0$. Then, the acquired free induction decay signals are divided into odd-numbered lines and even-numbered lines, and then the phase difference between the odd-numbered lines and even-numbered lines is divided by the sampling period to obtain the value of the main magnetic field frequency drift.

It should be noted that the acquired free induction decay signals are actually discrete point data with time series, so the odd-numbered lines and even-numbered lines actually divide these discrete point data based their odd-numbered and even-numbered orderings. That is, the specific method is: the data at odd-numbered sampling points in the signals is extracted as odd-numbered lines, and the data at even-numbered sampling points is extracted as even-numbered lines, so that a single line of signals can be divided into two lines of signals.

In addition, the phase difference between the two lines of signals is also calculated by using the sampling point data thereof. In the present disclosure, the representative value of the phase difference of corresponding sampling points in odd-numbered lines and even-numbered lines is calculated as the inter-line phase difference between odd-numbered lines and even-numbered lines, and then the value of the main magnetic field frequency drift is calculated from the inter-line phase difference and sampling period. In particular, the representative value in the present disclosure means an index that can represent the average level of the samples statistically, including but not limited to arithmetic mean, median, etc. Moreover, when calculating the representative value of the samples, the sampling points in all samples may be selected, or it can be calculated from sampling samples after sampling. However, from the point of view of facilitating the implementation of the method, it is recommended in the present disclosure that the arithmetic mean of all sampling points be used as the representative value. Therefore, the formula for calculating the value Δf of the main magnetic field frequency drift is:

$$\Delta f = \frac{\overline{\varphi}_{odd-even}}{2\pi \cdot \Delta T}$$

where ΔT is the sampling period of the free induction decay signals, i.e., the sampling time interval between two adjacent sampling points; $\overline{\varphi}_{odd-even}$ is the inter-line phase difference between the odd-numbered lines and the even-numbered lines, which is calculated by the arithmetic mean of all sampling points, and the calculation formula is:

$$\overline{\varphi}_{odd-even} = \frac{\sum_{i=1}^{n} \varphi^{odd-even}{}_i}{n}$$

where $\varphi^{odd-even}{}_i$ is the phase difference between the $i^{th}$ data sampling point of the odd-numbered lines and the $i^{th}$ data sampling point of the even-numbered lines, n is the number of the sampling points in the even-numbered lines or the odd-numbered lines.

Figure 2:
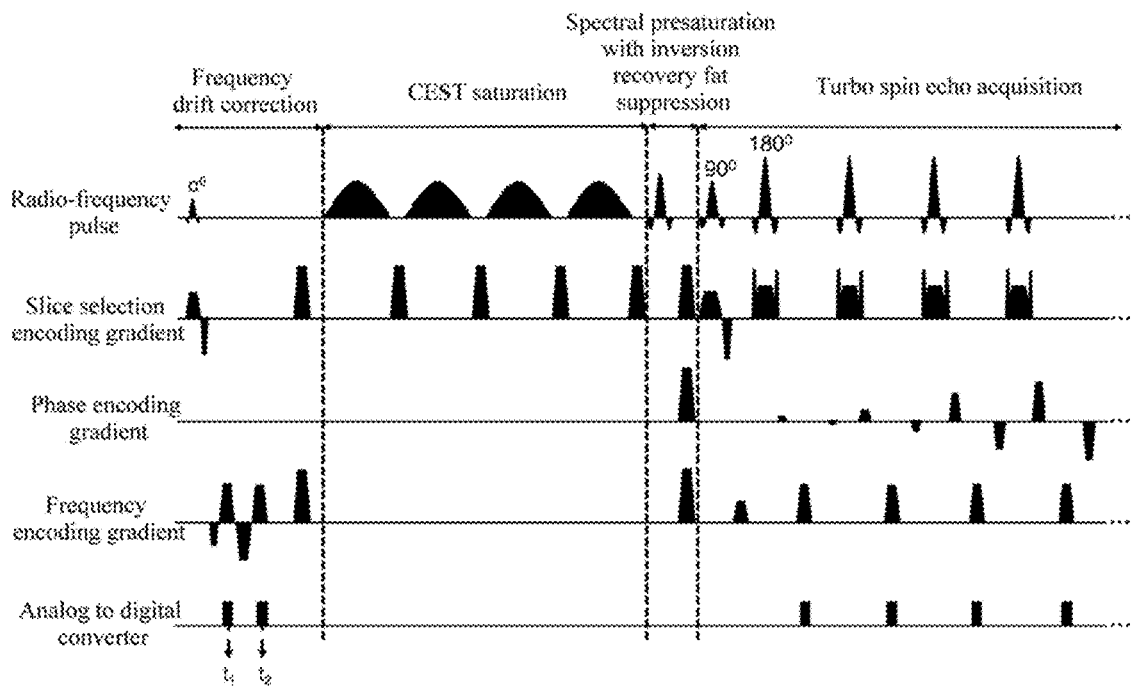
FIG. 2 is a block diagram of the magnetic resonance CEST imaging sequence based on the frequency drift correction module for acquiring gradient echo signals.

The second method is to acquire a line of non-phase encoding gradient echo signals at two different times immediately after the radio-frequency pulse is sent out. As shown in FIG. 2, the two signal acquisition times are recorded as $t_1$ and $t_2$, respectively. Then, the phase difference of the acquired two lines of non-phase encoding gradient echo signals is divided by the signal acquisition time difference of the two lines of non-phase encoding gradient echo signals to obtain the value of the main magnetic field frequency drift.

Similar to the former method, the non-phase encoding gradient echo signals are also discrete point data with time series, so the representative value of the phase difference of corresponding sampling points in two lines of non-phase encoding gradient echo signals needs to be calculated to obtain the phase difference between two lines of signals, and then the value of the main magnetic field frequency drift is calculated from the inter-line phase difference and the sampling time interval between two lines of non-phase encoding gradient echo signals. Similarly, the representative value here also includes but is not limited to an arithmetic mean, a median, etc. From the point of view of facilitating the implementation of the method, it is recommended in the present disclosure that the arithmetic mean of all sampling points be used as the representative value. Therefore, the formula for calculating the value $\Delta f$ of the main magnetic field frequency drift is:

$$\Delta f = \frac{\overline{\varphi}_{2-1}}{2\pi \cdot \Delta TE_{2-1}}$$

where $\Delta TE_{2-1}$ is the sampling time interval of the two lines of non-phase encoding gradient echo signals, i.e., $\Delta TE_{2-1} = t_2 - t_1$; $\overline{\varphi}_{2-1}$ is the inter-line phase difference between the two lines of non-phase encoding gradient echo signals, which is calculated by the arithmetic mean of all sampling points, and the calculation formula is:

$$\overline{\varphi}_{2-1} = \frac{\sum_{i=1}^{n} \varphi^{2-1}{}_i}{n}$$

where $\varphi^{2-1}{}_i$ is the phase difference between respective $i^{th}$ data sampling points of the two lines of non-phase encoding gradient echo signals, $\varphi^{2-1}{}_i = \varphi^2{}_i - \varphi^1{}_i$, in which $\varphi^2{}_i$ is the phase of the $i^{th}$ data sampling points in the second row of the non-phase encoding gradient echo signals, and $\varphi^1{}_i$ is the phase of the $i^{th}$ data sampling points in the first row of the non-phase encoding gradient echo signals; n is the number of the sampling points in each line of non-phase encoding gradient echo signals.

S3, after obtaining the value of the main magnetic field frequency drift according to either of the above two methods, the radio-frequency pulse of magnetic resonance CEST imaging and the center frequency of the data acquisition device can be adjusted in real time according to the drift value. Subsequently, conventional magnetic resonance CEST imaging can be performed according to the adjusted center frequency of the radio-frequency pulse.

Therefore, the present disclosure provides a method for frequency drift correction based on acquiring free induction decay signals or gradient echo signals, and the method can not only realize real-time correction of the frequency drift of the main magnetic field, but also ensure effective suppression of fat signals, thereby improving the robustness and repeatability of magnetic resonance CEST imaging. The magnetic resonance CEST imaging here can adopt conventional magnetic resonance CEST imaging, which will be briefly introduced since it is not the focus of the present disclosure. The conventional magnetic resonance CEST imaging sequence includes three modules: a CEST saturation module, a spectral presaturation with inversion recovery fat suppression module, and a turbo spin echo acquisition module:

(1) CEST saturation module: this module contains four Gaussian or rectangular saturation pulses, and a spoiler gradient is applied between saturation pulses.

(2) Spectral presaturation with inversion recovery fat suppression module: this module includes a radio-frequency pulse with a flip angle greater than 90°, and the radio-frequency pulse is followed by a spoiler gradient applied in the slice selection direction, the phase encoding direction and the frequency encoding direction respectively.

(3) Turbo spin echo acquisition module: this module mainly includes a 90° radio frequency excitation pulse and a plurality of 180° refocusing pulses, and the slice selection encoding gradient is applied while applying the radio frequency excitation pulse and refocusing pulsed, each 180° refocusing pulse is followed by the phase encoding gradient and the frequency encoding gradient, and an analog-digital converter is used for data acquisition when applying the frequency encoding gradient.

Corresponding to the above frequency drift correction method, a method for frequency drift correction of magnetic resonance CEST imaging based on acquiring free induction decay signals or gradient echo signals can also be provided, and the device includes a frequency drift correction module, wherein, the frequency drift correction module is used to perform S1-S3 (specifically, as described before, which will not be repeated here), complete the real-time correction of the frequency drift of the main magnetic field and ensure the effective suppression of fat signals. After the real-time correction of the frequency drift of the main magnetic field is completed, the CEST imaging system is responsible for the conventional magnetic resonance CEST imaging according to the adjusted center frequency of the radio-frequency pulse.

Those skilled in the art should know that the modules and functions involved in the present disclosure can be realized by circuits, other hardware or executable program codes, as long as the corresponding functions can be realized. If codes are adopted, the codes can be stored in a storage device and executed by the corresponding elements in a computing device. The implementation of the present disclosure is not limited to any specific combination of hardware and software. All hardware models in the present disclosure can be commercially available products and can be selected according to actual requirements of the user. Of course, other necessary hardware or software may also be required for cooperation in the magnetic resonance CEST imaging sequence and device, which will not be repeated here.

In an embodiment, the method for frequency drift correction in S1 to S3 described above can be stored in the form of a software program and a computer-readable storage medium. When the computer program is called and executed by a processor, the frequency drift correction of magnetic resonance CEST imaging can be realized according to the steps of S1 to S3.

Computer-readable storage media are generally provided in the form of memory hardware. The memory may include a Random Access Memory (RAM) or a Non-Volatile Memory (NVM), such as at least one disk memory.

The processor of the above processing program may be a general-purpose processor, including a Central Processing Unit (CPU), a Network Processor (NP), etc.; it can also be a Digital Signal Processing (DSP), a disclosure specific integrated circuit (ASIC), a Field-Programmable Gate Array (FPGA) or other programmable logic devices, discrete gate or transistor logic devices, and discrete hardware components.

It is obvious that with the wide application of cloud servers, the above software programs can also be installed on a cloud platform to provide corresponding services, so the computer-readable storage medium is not limited to the form of local hardware.

In another embodiment, the method for frequency drift correction in S1 to S3 described above can be integrated into a control unit of a magnetic resonance imaging device in the form of a frequency correction program. The magnetic resonance imaging device should include a conventional magnetic resonance scanner and a control unit. In addition to the frequency correction program mentioned above, the control unit should also have an imaging sequence and other software programs necessary to realize CEST imaging. Before using this magnetic resonance imaging device for imaging, it is necessary to first execute a correction program to correct the center frequency of the magnetic resonance imaging device, and then run the CEST imaging sequence, and the magnetic resonance scanner will perform magnetic resonance CEST imaging according to the corrected center frequency. The magnetic resonance scanner can be implemented by existing technology, and belongs to mature commercial products and will not be described again. The above frequency correction program can also be directly integrated into a control system of the magnetic resonance scanner, without additional control units.

Based on the above methods, the concrete technical effects will be shown by reference to examples, so that those skilled in the art can better understand the essence of the present disclosure.

EXAMPLES

A comparison test was carried out between the magnetic resonance CEST imaging sequence based on the frequency drift correction module for acquiring free induction decay signals or gradient echo signals mentioned above and a conventional magnetic resonance CEST imaging sequence to which the frequency drift correction module was not applied respectively in magnetic resonance CEST imaging experiments of a water phantom and of 15 tested brains. See the above S1-S3 for details, which will not be repeated here. Only the specific parameters here will be introduced below. In this example, the target slice is excited by a radio-frequency pulse with a flip angle of 3°, and a single line of free induction decay signals (as shown in FIG. 1) was respectively acquired at $t_0$=6.98 ms or two lines of non-phase encoding gradient echo signals (as shown in FIG. 2) were acquired at $t_1$=2.52 ms and $t_2$=8.33 ms, and the number of sampling points of each line of free induction decay signals or non-phase encod gradient echo signals was n=128.

In this example, the three modules of the conventional magnetic resonance CEST imaging sequence were as follows:

(1) CEST saturation module: this module contained four Gaussian saturation pulses with a duration of 200 ms and an amplitude of 2 uT, and a spoiler gradient with a duration of 5 ms and an amplitude of 15 mT/m was applied behind the saturation pulse.

(2) Spectral presaturation with inversion recovery fat suppression module: this module contained a radio-frequency pulse with a flip angle of 110°, and the radio-frequency pulse was followed by a spoiler gradient applied in the slice selection direction, the phase encoding direction and the frequency encoding direction respectively, with a duration of 3.5 ms and an amplitude of 8 mT/m.

(3) Turbo spin echo acquisition module: this module mainly included one 90° radio frequency excitation pulse and forty-two 180° refocusing pulses, and a slice selection encoding gradient was applied while applying the radio frequency excitation pulse and refocusing pulses, each 180° refocusing pulse was followed by a phase encoding gradient and a frequency encoding gradient, and an analog-digital converter was used for data acquisition when the frequency encoding gradient was applied.

Figure 3:
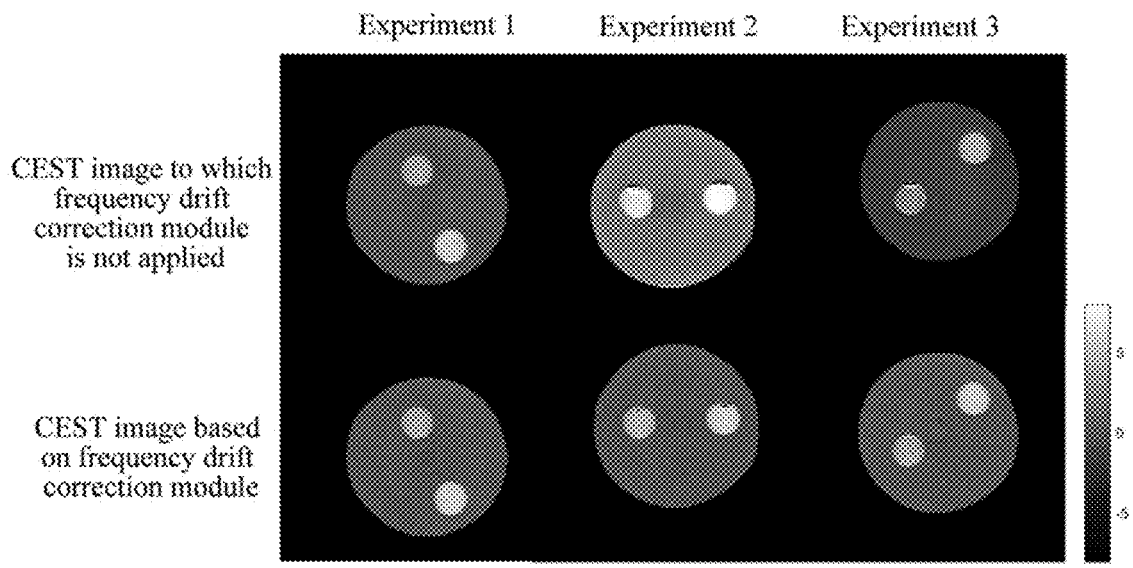
FIG. 3 is a comparison of the CEST images in a phantom scanning experiment between the magnetic resonance CEST imaging sequence based on the frequency drift correction module acquiring free induction decay signals and the conventional magnetic resonance CEST imaging sequence to which the frequency drift correction module is not applied.
Figure 4:
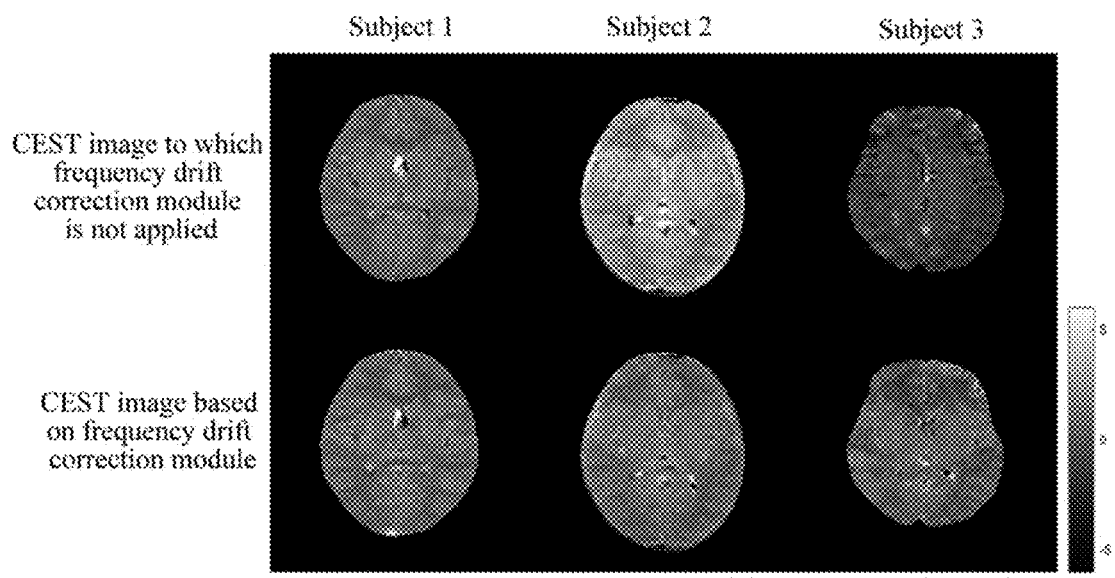
FIG. 4 is a comparison of the CEST images in a human brain scanning experiment between the magnetic resonance CEST imaging sequence based on the frequency drift correction module acquiring free induction decay signals and the conventional magnetic resonance CEST imaging sequence to which the frequency drift correction module is not applied.
Figure 5:
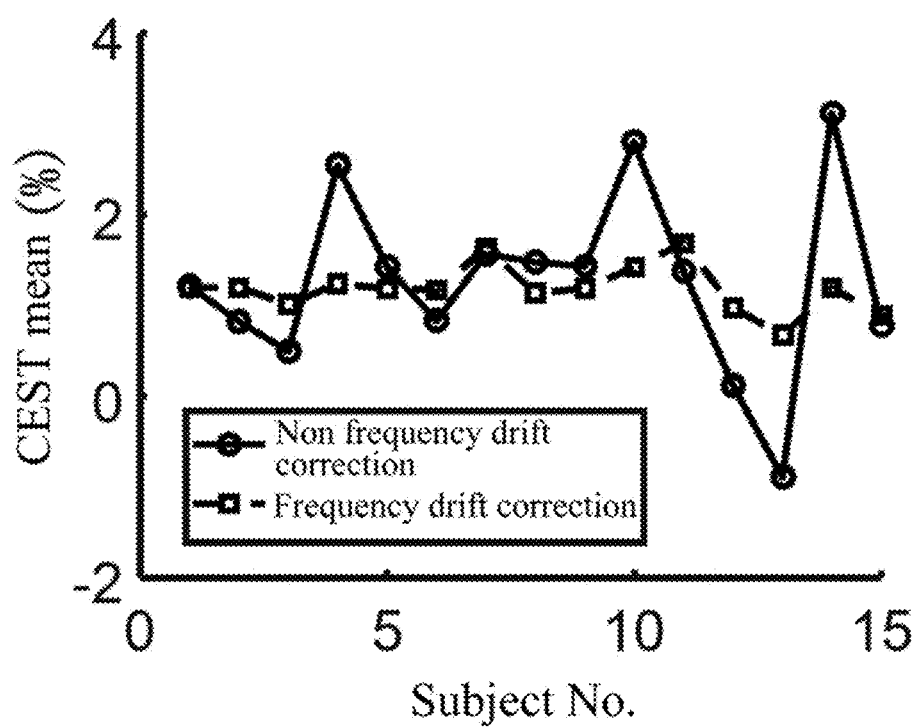
FIG. 5 is a comparison of the CEST mean values of the region of interest on the CEST images obtained in the human brain scanning experiment between the magnetic resonance CEST imaging sequence based on the frequency drift correction module acquiring free induction decay signals and the conventional magnetic resonance CEST imaging sequence to which the frequency drift correction module is not applied.

In this example, the comparative experimental results of the magnetic resonance CEST imaging sequence based on the frequency drift correction module for acquiring free induction decay signals and the conventional magnetic resonance CEST imaging sequence to which the frequency drift correction module is not applied are shown in FIGS. 3, 4 and 5.

As can be seen from FIGS. 3 and 4, no matter in the phantom or in the brain magnetic resonance CEST imaging experiment of healthy tested brains, the frequency drift of the main magnetic field leads to large image artifacts in the CEST images obtained by the conventional magnetic resonance CEST sequence to which the frequency drift correction module is not applied. However, the magnetic resonance CEST imaging sequence based on the frequency drift correction module that acquires free induction decay signals can correct the frequency drift of the main magnetic field in real time, and the obtained CEST image is relatively stable, which shows the effectiveness of the present disclosure.

As can be seen from FIG. 5, the CEST mean value of the region of interest on the CEST image obtained by the conventional magnetic resonance CEST sequence to which the frequency drift correction module is not applied fluctuates drastically, while the CEST mean value obtained by the magnetic resonance CEST imaging sequence based on the frequency drift correction module that acquires free induced decay signal is stable, which further proves the effectiveness of the present disclosure.

It should be pointed out that the test results of the magnetic resonance CEST imaging sequence based on the frequency drift correction module for acquiring gradient echo signals are theoretically consistent with those of the frequency drift correction module based on acquiring free induction decay signals. Therefore, in this example, only the magnetic resonance CEST imaging sequence results based on the frequency drift correction module for acquiring free induction decay signals are shown to prove that both solutions involved in the present disclosure are effective.

Furthermore, the example described above is only a preferred solution of the present disclosure, but it is not intended to limit the present disclosure. Those of ordinary skill in the relevant technical field can make various changes and modifications without departing from the spirit and scope of the present disclosure. Therefore, all technical solutions obtained by equivalent replacements or equivalent transformations fall within the scope of protection of the present disclosure.

What is claimed is:

1. A method for frequency drift correction of magnetic resonance CEST imaging, comprising the following steps:
    S1, controlling a CEST imaging system to emit a radio-frequency pulse with a flip angle less than 90° to excite a target slice;
    S2, after the radio-frequency pulse is sent out, acquiring a single line of free induction decay signals and implementing step S21, or acquiring a line of non-phase encoding gradient echo signals at two different times respectively and implementing step S22;
    S21, dividing the acquired free induction decay signals into odd-numbered lines and even-numbered lines, and dividing an inter-line phase difference between the odd-numbered lines and the even-numbered lines by a sampling period to obtain a value of a main magnetic field frequency drift;
    S22, dividing the phase difference of the acquired two lines of non-phase encoding gradient echo signals by a signal acquisition time difference therebetween to obtain the value of the main magnetic field frequency drift;
    S3, adjusting a center frequency of a magnetic resonance device in real time according to the obtained value of the main magnetic field frequency drift.

2. The method for frequency drift correction of magnetic resonance CEST imaging according to claim 1, the value of a main magnetic field frequency drift in step S21 is calculated by:
    dividing the single line of free induction decay signal into odd-numbered lines defined by the odd sampling points data of the free induction decay signal and even-numbered lines defined by the even sampling points data of the free induction decay signal;
    calculating a representative value of phase differences of corresponding sampling points in the odd-numbered lines and the even-numbered lines as an inter-line phase difference between odd-numbered lines and even-numbered lines; and
    calculating the value of a main magnetic field frequency drift from the inter-line phase difference and the sampling period,
    wherein the representative value comprises an arithmetic mean or a median.

3. The method for frequency drift correction of magnetic resonance CEST imaging according to claim 2, wherein the calculation formula of the value $\Delta f$ of the main magnetic field frequency drift is:

$$\Delta f = \frac{\overline{\varphi}_{odd-even}}{2\pi \cdot \Delta T}$$

where $\Delta T$ is the sampling period of the free induction decay signals; $\overline{\varphi}_{odd-even}$ is the inter-line phase difference between the odd-numbered lines and the even-numbered lines, and the calculation formula is:

$$\overline{\varphi}_{odd-even} = \frac{\sum_{i=1}^{n} \varphi^{odd-even}{}_i}{n}$$

where $\overline{\varphi}^{odd-even}{}_i$ is a phase difference between an $i^{th}$ data sampling point of the odd-numbered lines and an $i^{th}$ data sampling point of the even-numbered lines, and n is a number of the sampling points in the even-numbered lines or the odd-numbered lines.

4. The method for frequency drift correction of magnetic resonance CEST imaging according to claim 1, the value of a main magnetic field frequency drift in step S22 is calculated by:
    calculating a representative value of phase differences of corresponding sampling points in two lines of non-phase encoding gradient echo signals as an inter-line phase difference between the two lines of non-phase encoding gradient echo signals, and then calculating a value of the main magnetic field frequency drift from the inter-line phase difference and the sampling time interval of the two lines of non-phase encoding gradient echo signals.

5. The method for frequency drift correction of magnetic resonance CEST imaging according to claim 4, the calculation formula of the value $\Delta f$ of the main magnetic field frequency drift is:

$$\Delta f = \frac{\overline{\varphi}_{2-1}}{2\pi \cdot \Delta TE_{2-1}}$$

where $\Delta TE_{2-1}$ is the sampling time interval of the two lines of non-phase encoding gradient echo signals; $\overline{\varphi}_{2-1}$ is the inter-line phase difference between the two lines of non-phase encoding gradient echo signals, and the calculation formula is:

$$\overline{\varphi}_{2-1} = \frac{\sum_{i=1}^{n} \varphi^{2-1}{}_i}{n}.$$

where $\varphi^{2-1}{}_i$ is the phase difference between respective $i^{th}$ data sampling points of the two lines of non-phase encoding gradient echo signals, n is the number of the sampling points in each line of non-phase encoding gradient echo signals.

6. The method for frequency drift correction of magnetic resonance CEST imaging according to claim 1, wherein the flip angle in S1 is less than 10°.

7. A non-transitory computer-readable storage medium, wherein a computer program is stored on the storage medium, and the computer program, when executed by a processor, implements the method for frequency drift correction of magnetic resonance CEST imaging according to claim 1.

8. A magnetic resonance imaging device, comprising a magnetic resonance scanner and a control unit, wherein a computer program is stored in the control unit, and the computer program, when executed, is configured to implement the method for frequency drift correction of magnetic resonance CEST imaging according to claim 1; the magnetic resonance scanner performs magnetic resonance CEST imaging according to a corrected center frequency.

\* \* \* \* \*